(12) United States Patent
Romanovskyy

(10) Patent No.: US 8,400,852 B2
(45) Date of Patent: Mar. 19, 2013

(54) CIRCUIT WITH REMOTE AMPLIFIER

(75) Inventor: Sergiy Romanovskyy, Ottawa (CA)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 167 days.

(21) Appl. No.: 13/040,712

(22) Filed: Mar. 4, 2011

(65) Prior Publication Data
US 2012/0224442 A1 Sep. 6, 2012

(51) Int. Cl.
*G11C 7/00* (2006.01)
(52) U.S. Cl. .......... 365/194; 365/154; 365/189.15; 365/189.16; 365/190; 365/207
(58) Field of Classification Search .......... 365/198
See application file for complete search history.

(56) References Cited

U.S. PATENT DOCUMENTS

| | | | | |
|---|---|---|---|---|
| 5,331,233 A | * | 7/1994 | Urakawa | 327/52 |
| 6,061,296 A | * | 5/2000 | Ternullo et al. | 365/233.11 |
| 6,111,796 A | * | 8/2000 | Chang et al. | 365/196 |
| 7,423,920 B2 | * | 9/2008 | Koo | 365/194 |

OTHER PUBLICATIONS

Taito, Yasuhiko, et al., "An Embedded DRAM With a 143-MHz SRAM Interface Using a Sense-Synchronized Read/Write", IEEE Journal of Solid-State Circuits, vol. 38, No. 11, Nov. 2003, pp. 1967-1973.

Kuroda, Naoki, et al., "A 1.8-ns Random Cycle SRAM-Interface High-Speed DRAM (SH-RAM) Compiler with Data Line Replica Architecture", IEEE Asian Solid-State Circuits Conference, Nov. 3-5, 2008, Fukuoka, Japan, pp. 233-236.

Romanovsky, Sergey, et al., "A 500MHz Random-Access Embedded 1Mb DRAM Macro in Bulk CMOS", 2008 IEEE International Solid-State Circuits Conference.

* cited by examiner

*Primary Examiner* — Tan T. Nguyen
(74) *Attorney, Agent, or Firm* — Lowe Hauptman Ham & Berner, LLP

(57) ABSTRACT

A circuit comprises a first driver, a second driver, and a remote sense amplifier. The first driver is configured to generate a first data signal on a first data line. The second driver is configured to generate a control signal on a control signal line. An RC delay of the control signal line is less than an RC delay of the first data line. The remote sense amplifier is configured to receive the first data signal, a second data signal on a second data line, and the control signal. The control signal line is configured for the control signal to enable the remote sense amplifier to amplify the voltage difference between the first data signal and the second data signal at inputs of the remote sense amplifier, if the voltage difference reaches a predetermined value.

22 Claims, 3 Drawing Sheets

CIRCUIT WITH REMOTE AMPLIFIER

FIELD

The present disclosure is related to a circuit with a remote amplifier.

BACKGROUND

Global bit lines are known as input/output (IO) or data lines in dynamic random access memories (DRAMs). Global bit lines are commonly built as differential pairs (i.e., lines GBL and corresponding lines GBLb), and serve to bi-directionally transfer the data between multiple memory banks and IO interfaces. For example, global bit lines transfer the read data from the memory banks to the interfaces, and transfer the write data from the interfaces to the memory banks. Depending on the architecture of the memory, there can be up to a thousand pairs of global bit lines GBL and GBLb in a memory. Further, global bit lines are very long, e.g., over 1 millimeter (mm). The capacitance on a global bit line is around several hundreds femtofarads (fF). Because of the large number of global bit lines, global bit lines are normal designed to be narrow, and therefore, have high resistance, e.g., around 2 kΩ.

To achieve high memory density and to save die areas, global bit lines usually do not have any intermediate amplifiers to boost the signals carried by global bit lines when the signals are weak. At high speed, e.g., above 400 MHz, however, propagating write signal data through global bit lines is difficult. For example, the write data on global bit lines need to be available at the memory bank inputs before the local bit line sense amplifiers are activated. Further, the data on global bit lines are to be at a rail-to-rail swing at the local bit line sense amplifier inputs. Achieving such goals is difficult because global bit lines are long, and the RC delay on global bit lines is high. RC delay is a time delay based on the resistance and capacitance characteristic of an electrical line.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Figure 1:
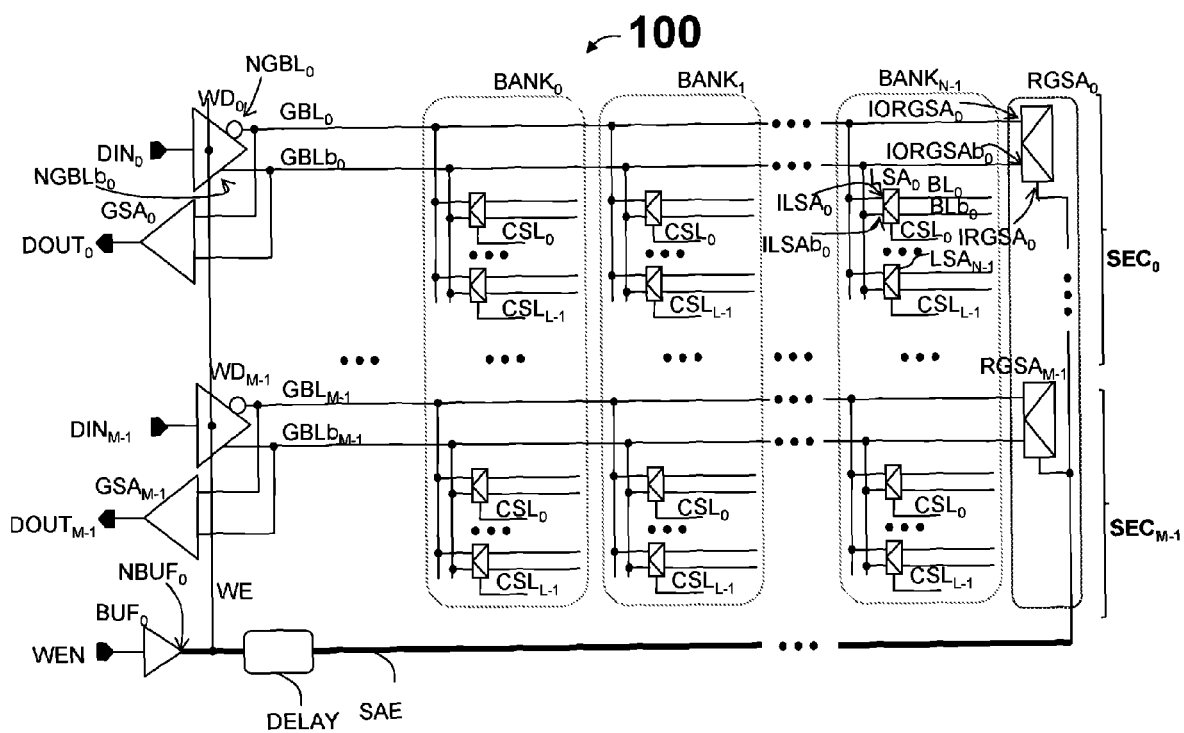
FIG. 1 is a block diagram of a DRAM, in accordance with a first embodiment.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art. Reference numbers may be repeated throughout the embodiments, but they do not require that feature(s) of one embodiment apply to another embodiment, even if they share the same reference number.

Some embodiments have one or a combination of the following features and/or advantages. The weak signals on the opposite end or end lines of global bit lines are amplified. The data transfer across global bit lines is sped up in a write cycle. The speed for writing data to memory cells is therefore improved.

Exemplary Circuit

FIG. 1 is a diagram of a dynamic random access memory (DRAM) 100, in accordance with some embodiments.

Memory 100 is illustratively shown having M sections from sections $SEC_0$ to $SEC_{M-1}$. For illustration, elements having labels with a subscript 0 are associated with section $SEC_0$. Elements having labels with a subscript 1 are associated with section $SEC_1$, elements having labels with a subscript 2 are associated with section $SEC_2$, and elements having labels with a subscript "M-1" are associated with section $SEC_{M-1}$, etc.

Memory 100 is also illustratively shown having N memory banks from memory bank $BANK_0$ to $BANK_{N-1}$. Each memory bank BANK includes a plurality of local sense amplifiers LSA in each of the sections SEC. For example, memory bank $BANK_{N-1}$ includes L local sense amplifiers $LSA_0$ to $LSA_{L-1}$ in section $SEC_0$, L local sense amplifiers $LSA_0$ to $LSA_{L-1}$ in section $SEC_T$, L local sense amplifiers $LSA_0$ to $LSA_{L-1}$ in section $SEC_2$, etc. To not obscure the drawings, only local sense amplifiers $LSA_0$ and $LSA_{L-1}$ of sec $SEC_0$ of bank $BANK_{N-1}$ are labeled.

A local sense amplifier LSA is coupled to a pair of global bit lines GBL and GBLb on one side and a pair of local bit lines BL and BLb on the other side. For simplicity, only a pair of bit lines $BL_0$ and $BLb_0$ coupled to local sense amplifier $LSA_0$ of sec $SEC_0$ of memory bank $BANK_{N-1}$ is labeled. A memory cell is coupled to local bit lines BL or BLb. There are a plurality of memory cells coupled to each pair of bit lines BL and BLb. For simplicity, the memory cells are not shown.

One global sense amplifier GSA is included in each section SEC. In FIG. 1, there are M global sense amplifiers $GSA_0$ to $GSA_{M-1}$ corresponding to M sections $SEC_0$ to $SEC_{M-1}$. A global sense amplifier GSA processes the data appears on a corresponding pair of global bit lines GBL and GBLb and provides the output on a line DOUT. In a read cycle, the data stored in a memory cell travels from the memory cell through the corresponding bit lines BL and BLb, local sense amplifier LSA, global bit lines GBL and GBLb, global sense amplifier GSA, and data out DOUT.

One write driver WD is included in each section SEC. In FIG. 1, there are M write drivers $WD_0$ to $WD_{M-1}$ corresponding to M sections $SEC_0$ to $SEC_{M-1}$. A write driver WD receives as inputs signals DIN and generates at nodes NGBL and NGBLb data or signals SGBL and SGBLb on a corresponding pair of global bit lines GBL and GBLb. For simplicity, signals SGBL and SGBLb are not labeled. In a write operation, signals SGBL and SGBLb on global bit lines GBL and GBLb travel from nodes NGBL and NGBLb to nodes ILSA and ILSAb, through a corresponding local sense amplifier LSA, the corresponding local bit lines BL and BLb, and the memory cells coupled to local bit lines BL and BLb. Signals SGBL and SGBLb also reach nodes IORGSA and IORGSAb of remote global sense amplifiers RGSA.

In various embodiments, in a write cycle, signals SGBL and SGBLb on global bit lines GBL and GBLb take a long time to travel from nodes NGBL and NGBLb to nodes ILSA and ILSAb of corresponding local sense amplifiers LSA. Explained differently, soon after the time write drivers WD are enabled to provide signals SGBL and SGBLb, signals SGBL and SGBLb at nodes NGBL and NGBLb are strong or at a full swing. Signals SGBL and SGBLb at nodes ILSA and ILSAb, however, are weak. Alternatively stated, signals SGBL and SGBLb at nodes ILSA and ILSAb are not at a full swing, or at a shrunk level. As a result, in many situations, local sense amplifiers LSA wait for weak signals SGBL and SGBLb at nodes ILSA and ILSAb to be developed to a full swing because the full swing enables local sense amplifiers LSA to flip data faster for writing. Consequently, transferring signals SGBL and SGBLb to the corresponding local bit lines BL and BLb is delayed, resulting in a slow write cycle. The situation is worsened when the local sense amplifier LSA is further away from the corresponding write drive WD. That is, signals SGBL and SGBLb are weaker and weaker when the local sense amplifier LSA is in memory bank $BANK_{N-3}$, memory $BANK_{N-2}$, memory bank $BANK_{NTh}$ etc.

Control signal line SAE has signal SSAE, which, for simplicity, is not labeled. A remote global sense amplifier RGSA and signal SSAE are used to amplify weak signals SGBL and SGBLb at nodes IORGSA and IORGSAb. In some embodiments, the voltage level of signals SGBL and SGBLb at nodes IORGSA and IORGSAb are close to the voltage level of signals SGBL and SGBLb at nodes ILSA and ILSAb in memory bank $BANK_{N-1}$. In FIG. 1, there are M remote global sense amplifiers $RGSA_0$ to $RGSA_{M-1}$ corresponding to M sections $SEC_0$ to $SEC_{M-1}$. In some embodiments, a remote global sense amplifier RGSA amplifies the differential signal of weak signals SGBL and SGBLb at nodes IORGSA and IORGSAb. In other words, the sense amplifier RGSA amplifies the voltage difference between signal SGBL and signal SGBLb at nodes IORGSA and IORGSAb. For illustration, the voltage difference between signals SGBL and SGBLb is called a global bit line split or a bit line split. In some embodiments, a sense amplifier RGSA amplifies weak signals SGBL and SGBLb at nodes IORGSA and IORGSAb when the bit line split at nodes IORGSA and IORGSAb reaches a predetermined voltage level.

Driver or buffer $BUF_0$ receives as a write enable input signal WEN and provides write signal WE and remote sense amplifier enable signal SSAE. In some embodiment, signal WEN is generated by a control block (not shown). Signal WE activates write drivers $WD_0$ to $WD_{M-1}$ to provide corresponding signals SGBL and SGBLb on bit lines GBL and GBLb at node NGBL and NGBLb. Signal SSAE enables sense amplifiers $RGSA_0$ to $RGSA_{M-1}$ for sense amplifiers $RGSA_0$ to $RGSA_{M-1}$ to amplify signals GBL and GBLb at nodes IORGSA and IORGSAb.

Delay circuit DELAY is configured to provide an adjustable delay to control the time signal SSAE travels from node $NBUF_0$ to nodes IRGSA.

Control signal line SAE is a "fast" line compared to global bit lines GBL and GBLb. In some embodiments, the resistance on a global bit line GBL is the same as the resistance on a global bit line GBLb. Further, the resistance of control signal line SAE is designed such that it is much lower than the resistance of global bit lines GBL and GBLb. In some embodiments, an RC delay of signal line SAE is several times less than the RC delay of global bit lines GBL and GBLb. Physically, in some embodiments, signal line SAE has a width larger than the width of global bit lines GBL and GBLb. In some embodiments, control signal line SAE includes two different metal lines coupled together to reduce area and fringe capacitance. Additionally, control signal line SAE is spaced apart from other signal lines to reduce capacitance cross-coupled by the other lines. As a result, signal SSAE traveling from node $NBUF_0$ to a corresponding node IRGSA is faster than signals SGBL and SGBLb traveling from nodes NGBL and NGBLb to the corresponding nodes IORGSA and IORGSAb.

In some embodiments, as soon as the bit line split of signals SGBL and SGBLb at nodes RGSA and RGSAb reaches a minimum threshold voltage, the corresponding remote global sense amplifier RGSA is configured to amplify the bit line split to a full swing signal. To that end, signal SSAE is configured such that signal SSAE that is available at node $NBUF_0$ is available in time at the corresponding node IRGSA to enable the corresponding sense amplifier RGSA. In other words, remote global sense amplifier RGSA is configured to amplify the bit line split of weak signals SGBL and SGBLb based on the timing relationship between the time the signals SGBL and SGBLb travel from nodes NGBL and NGBLb to nodes IORGSA and IORGSAb and the time signal SSAE travels from node $NBUF_0$ to node IRGSA. In various embodiments, the RC delay of line SAE is configured such that when the bit line split of signals SGBL and SGBL at nodes IORGSA and IORGSAb reaches the predetermined voltage, signal SSAE is available at node IRGSA to enable sense amplifiers RGSA to perform the amplification. In some embodiments, signal SSAE is sufficient to enable sense amplifiers RGSA when signal SSAE reaches a predetermined (high) voltage value. Further, signal SSAE is buffered by one or a plurality of buffers $BUF_1$ (not shown) to regain signal strength while signal SSAE travels from node $NBUF_0$ to node IRSGA.

In some embodiments, simulation is performed to determine the time it takes for the bit line split of weak signals SGBL and SGBLb at nodes IORGSA and IORGSAb to develop to the predetermined voltage value sensible by a sense amplifier RGSA. The time it takes for signal SSAE to travel from node $NBUF_0$ to node IRGSA is then determined such that when the bit line split reaches the predetermined voltage value, signal SSAE is available to enable sense amplifier RGSA for sense amplifier RGSA to amplify the bit line split. For example, signal SSAE is sufficient to enable sense amplifier RGSA when signal SSAE reaches a predetermined high voltage value. The time it takes for signal SSAE to travel from node $NBUF_0$ to node IRSGA depends on the resistance on line SAE, the characteristic of buffer $BUF_1$, and the programmable delay generated by delay circuit DELAY. In some embodiments, circuit DELAY is programmable and configured to provide various delays as desired.

After signals SGBL and SGBLb at nodes IORGSA and IORGSAb are amplified to a full swing, the amplified and full swing signals SGBL and SGBLb travel to the corresponding nodes ILSA and ILSAb. In effect, signals SGBL and SGBLb are driven by both write drivers WD and remote global sense amplifiers RGSA. The local sense amplifiers LSA in each memory bank BANK then receive the amplified signals at nodes ILSA and ILSAb, and transfer them to the corresponding local bit lines BL and BLb to be written into the memory cells coupled to those local bit lines BL and BLb.

Various embodiments are advantageous over other approaches. The signals SGBL and SGBLs generated at nodes NGBL and NGBLb that appear as shrunk signals at nodes IORGSA and IORGSAb are amplified then travel to nodes ILSA and ILSAb. The time for such amplification and traveling is faster than the time for signals SGBL and SGBLs generated at nodes NGBL and NGBLb that appear as shrunk signals at nodes ILSA and ILSAb and that develop to a signal that can be used by local sense amplifiers LSA. As a result, transferring signals SGBL and SGBLb after signals SGBL and SGBLb are provided by write drivers WD to local bit lines BL and BLb is faster, resulting in faster writing to memory cells coupled to local bit lines BL and BLb.

In various embodiments, remote global sense amplifiers RGSA are not used when signals SGBL and SGBLb at nodes ILSA and ILSAb in the corresponding memory banks are still strong. For example, when the data are written to memory banks BANK that are closer to nodes NGBL and NGBLb, including for example, bank $BANK_0$, $BANK_1$, $BANK_2$, etc., (versus the further away banks $BANK_{N-3}$, $BANK_{N-2}$, $BANK_{N-1}$, etc.).

Remote sense amplifiers RGSA shown to the right of memory bank $BANK_{N-1}$ or at the end of global bit lines GBL and GBLb are for illustration. Various locations of sense amplifiers RGSA are within the scope of various embodiments. For example, sense amplifiers RGSA are in the middle between memory bank $BANK_0$ and memory $BANK_{NTh}$, two thirds or three quarters of the way from memory bank $BANK_0$ to memory $BANK_{N-1}$, etc.

Figure 2:
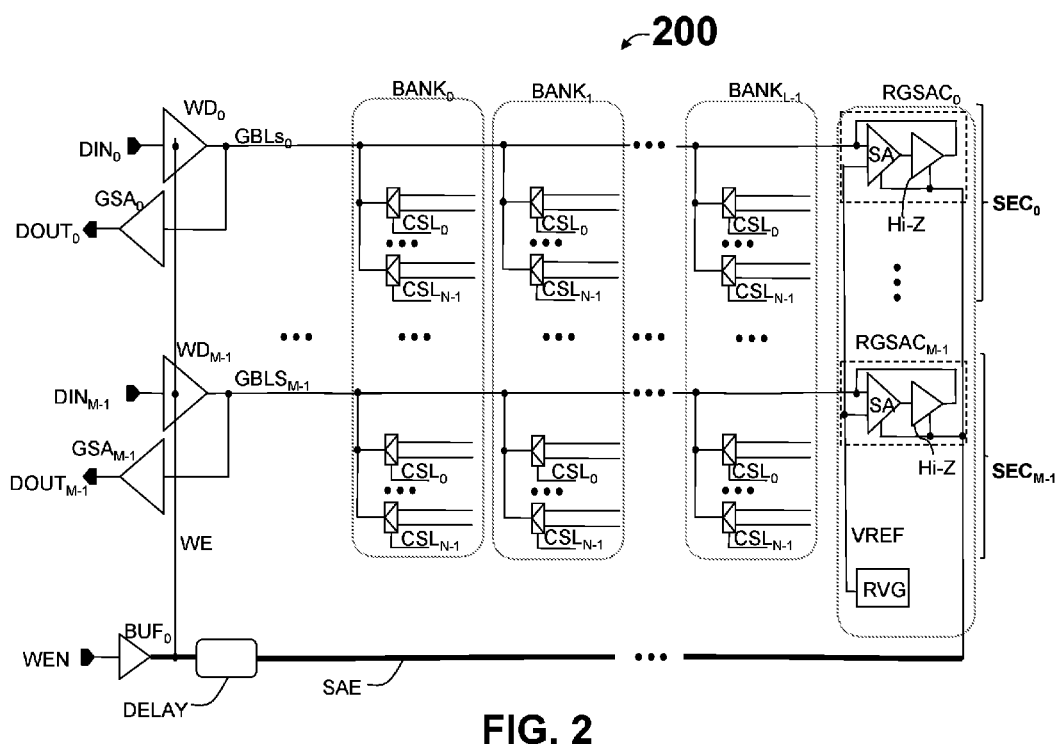
FIG. 2 is a block diagram of a DRAM, in accordance with a second embodiment.

FIG. 2 is a diagram of a memory 200, in accordance with some embodiments. In circuit 200, there is only one global bit line GBLS in each section SEC, instead of two paired global bit lines GBL and GBLb as in circuit 100. As a result, a signal SGBLS (not labeled) on a global bit line GBLS in FIG. 2 is an individual signal instead of a differential signal as in circuit 100 in FIG. 1. A reference voltage VREF generated by reference voltage generator RVG is used in place of the second global bit line signal. An amplifying circuit RGSAC replaces a remote global sense amplifier RGSA in FIG. 1, and amplifies a voltage difference between signal GBLS and the reference voltage VREF. In contrast, the sense amplifier RGSA in FIG. 1 amplifies the voltage difference between signals SGBL and SGBLb. An amplifying circuit RGSAC includes a sense amplifier SA and a high impedance or a tri-state buffer Hi-Z. Signal SAE turns on or off sense amplifier SA and buffer Hi-Z at the same time. When signal SAE is Low, both sense amplifier SA and buffer Hi-Z are off, act as open circuits, and have no effect on signal SGBLS. When signal SAE is High, however, sense amplifier SA amplifies the voltage difference between signal GBLS and voltage VREF, providing a result signal to buffer Hi-Z. Buffer Hi-Z then passes the result signal back to global bit line GBLS.

Write drivers WD and global sense amplifier GSAs are configured to adapt to the single global bit line GBLS.

Figure 3:
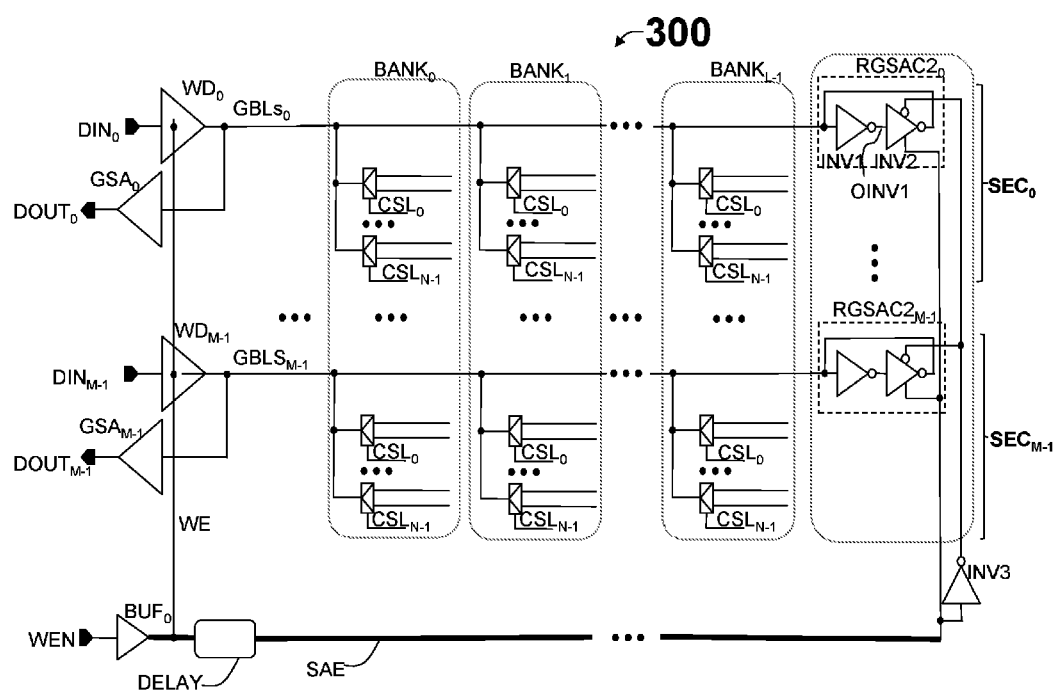
FIG. 3 is a block diagram of a DRAM, in accordance with a third embodiment.

FIG. 3 is a diagram of a memory 300, in accordance with some embodiments. Compared with memory 200, memory 300 does not use voltage VREF, and therefore does not include reference voltage generator RVG. Further, circuits RGSAC2 having corresponding inverters INV1 and INV2 replace circuits RGSA of memory 200 that amplify signals SGBLS with reference to reference voltage VREF. In contrast, circuits RGSAC2 of memory 300 amplify corresponding signals GBLS based on the threshold voltage of corresponding inverters INV1. For example, when a signal SGBLS on a bit line GBLS reaches the inverting threshold of an inverter INV1, inverter INV1 inverts signal GBLS to generate signal OINV1. Inverter INV2, being activated, then inverts signal OINV1 to provide signal SGBLS back on bit line GBLS. In some embodiments, inverter INV2 has a tri-state output coupled to bit line SGBLS. Signal SSAE activates or deactivates inverter INV2 both directly and through inverter INV3. Effectively, a circuit RGSAC2 amplifies signal SGBLS on bit line GBLS and provides the amplified signal back on the same bit line GBLS. As a result, circuits RGSAC2 are also amplifying circuits or amplifiers.

In some embodiments, the threshold voltage of inverter INV1 is adjusted to a predetermined value at which signal SGBLS is to be amplified. Stated differently, when signal SGBL reaches the predetermined inverting threshold of inverter INV1, inverter INV inverts signal SGBLS to provide signal OINV1. Providing the predetermined threshold voltage of an inverter INV1 is acquired by different methods including sizing inverter INV1.

A number of embodiments have been described. It will nevertheless be understood that various modifications may be made without departing from the spirit and scope of the disclosure.

For example, some embodiments regard a circuit comprising a first driver, a second driver, and a remote sense amplifier. The first driver is configured to generate a first data signal on a first data line. The second driver is configured to generate a control signal on a control signal line. The remote sense amplifier is configured to receive the first data signal, a second data signal on a second data line, and the control signal. The control signal line is configured for the control signal to enable the remote sense amplifier to amplify the voltage difference between the first data signal and the second data signal at inputs of the remote sense amplifier, if the voltage difference reaches a predetermined value. An RC delay of the control signal line is less than an RC delay of the first data line.

For another example, some embodiments regard a circuit comprising a remote global sense amplifier, a global bit line, a plurality of memory banks, and a control line. The global bit line has a global bit line signal and a global bit line RC delay. Each of the memory banks includes a plurality of local sense amplifiers. Each of the local sense amplifiers is coupled to the global bit line and a local bit line. The control line has a control signal and a control line RC delay less than the global bit line RC delay. The control line is configured for the control signal to enable the remote global sense amplifier. A time for the control signal to travel on the control line to the remote global sense amplifier is based on the global bit line RC delay and the control line RC delay.

For another example, some embodiments regard a circuit comprising a write driver, a remote sense amplifier, and a control driver. The write driver is configured to generate a pair of data signals on a pair of data lines. The remote sense amplifier is configured to receive the pair of data signals. The control driver is configured to generate a sense amplifier control signal on an amplifier control line and a write driver control signal on a write driver control line. An RC delay of the amplifier control signal line is less than an RC delay of each of the data lines of the pair of data lines. The write driver control signal is configured to enable the write driver. When the write driver generates the pair of data signals, a first voltage difference between the pair of data signals at the write driver is larger than a second voltage difference between the pair of data signals at the remote sense amplifier. The amplifier control signal is configured to enable the remote sense amplifier to amplify the second voltage difference when the second voltage difference reaches a predetermined value.

For another example, some embodiments regard circuit comprising a first driver, a second driver, and an amplifier. The first driver is configured to generate a data signal on a data line. The second driver is configured to generate a control signal on a control signal line. The amplifier is configured to receive the data signal at a data input node and to receive the control signal at a control input node. An RC delay of the control signal line is less than an RC delay of the data line such that, when the data signal is generated on the data line, a first voltage value of the data signal at the first driver differs from a second voltage value of the data signal at the data input of the amplifier. The control signal is configured to enable the sense amplifier to amplify the data signal after the second voltage value reaches a predetermined voltage value.

What is claimed is:

1. A circuit comprising:
a first driver configured to generate a first data signal on a first data line;
a second driver configured to generate a control signal on a control signal line; and
a remote sense amplifier configured to receive the first data signal, a second data signal on a second data line, and the control signal,
wherein
the control signal line is configured for the control signal to enable the remote sense amplifier to amplify a voltage difference between the first data signal and the second data signal at inputs of the remote sense amplifier, if the voltage difference reaches a predetermined voltage value; and
an RC delay of the control signal line is less than an RC delay of the first data line.

2. The circuit of claim 1, wherein the second data signal is a reference voltage signal.

3. The circuit of claim 1, wherein
the second data signal is generated by the first driver; and
the RC delay of the control signal line is less than an RC delay of the second data signal line.

4. The circuit of claim 1 further comprising a delay circuit configured to generate a time delay on the control signal line.

5. The circuit of claim 1, wherein the second driver is configured to further generate a driver control signal to control the first driver.

6. The circuit of claim 1 further comprising a plurality of memory banks; each memory banks including a plurality of local sense amplifiers; the first data line coupled to the plurality of local sense amplifiers of each of the memory banks.

7. The circuit of claim 1, wherein the RC delay of the control signal line and the RC delay of the first data line are calculated such that when the voltage difference reaches the predetermined voltage value, the control signal reaches a second predetermined voltage value.

8. A circuit comprising:
a remote global sense amplifier;
a global bit line coupled to the remote global sense amplifier, the global bit line having a global bit line signal and a global bit line RC delay;
a plurality of memory banks; each of the memory banks including a plurality of local sense amplifiers; each of the local sense amplifiers coupled to the global bit line and a local bit line; and
a control line having a control signal and a control line RC delay less than the global bit line RC delay; the control line configured for the control signal to enable the remote global sense amplifier,
wherein a time for the control signal to travel on the control line to the remote global sense amplifier is based on the global bit line RC delay and the control line RC delay.

9. The circuit of claim 8 further comprising a delay circuit configured to further affect the time for the control signal to travel on the control line to the remote global sense amplifier.

10. The circuit of claim 8 further comprising a data line having a data signal; the remote global sense amplifier configured to amplify a voltage difference between the global bit line signal and the data signal.

11. The circuit of claim 8 further comprising a second global bit line having a second global bit line signal and a second global bit line RC delay greater than the control signal RC delay; the remote sense amplifier configured to amplify a voltage difference between the global bit line signal and the second global bit line signal.

12. The circuit of claim 8, wherein the global bit line RC delay and the control line RC delay are calculated based on a time for the voltage difference between the global bit line signal and the data signal to develop to a predetermined value.

13. A circuit comprising:
a write driver configured to provide a pair of data signals on a pair of data lines;
a remote sense amplifier configured to receive the pair of data signals; and
a control driver configured to provide a sense amplifier control signal on an amplifier control line and a write driver control signal on a write driver control line,
wherein
a control RC delay of the amplifier control signal line is less than a data RC delay of each of the data lines of the pair of data lines;
the write driver control line is configured for the control signal to enable the write driver;
when the write driver generates the pair of data signals, a first voltage difference between the pair of data signals at the write driver is larger than a second voltage difference between the pair of data signals at the remote sense amplifier; and
the amplifier control line is configured for the amplifier control signal to enable the remote sense amplifier to amplify the second voltage difference when the second voltage difference reaches a predetermined value.

14. The circuit of claim 13, wherein
the pair of data lines includes a first global bit line and a second global bit line of a memory; and
the first global bit line and the second global bit line are each coupled to a plurality of plurality of local sense amplifiers; each of plurality of local sense amplifiers is part of memory bank of the memory.

15. The circuit of claim 13 further comprising a programmable delay circuit configured to generate a delay on the amplifier control line.

16. The circuit of claim 13 wherein the control RC delay and the data RC delay are used in calculating a time for the control signal to reach the remote sense amplifier.

17. The circuit of claim 13 wherein the control RC delay is calculated based on the data RC delay and a time for the second voltage difference to reach the predetermined value.

18. A circuit comprising:
a first driver configured to generate a data signal on a data line;
a second driver configured to generate a control signal on a control signal line; and
an amplifier configured to receive the data signal at a data input node and to receive the control signal at a control input node,
wherein
an RC delay of the control signal line is less than an RC delay of the data line such that, when the data signal is generated on the data line, a first voltage value of the data signal at the first driver differs from a second voltage value of the data signal at the data input of the amplifier; and
the control signal line is configured for the control signal to enable the sense amplifier to amplify the data signal after the second voltage value reaches a predetermined voltage value.

19. The circuit of claim 18, wherein
the amplifier includes an inverter having the data input node; and
the predetermined voltage value is a threshold of the inverter.

20. The circuit of claim 19, wherein
the amplifier further includes a second inverter configured to invert an output of the inverter; and
the control signal line is configured for the control signal to control the second inverter.

21. The circuit of claim 18 further comprising a delay circuit configured to generate a delay on the control signal line.

22. The circuit of claim 18 wherein
the data line is a global bit line of a memory and is coupled to a plurality of pluralities of local sense amplifiers; and
each plurality of local sense amplifiers is part of a memory bank of the memory.

* * * * *